(12) United States Patent
Ooi et al.

(10) Patent No.: US 7,038,904 B2
(45) Date of Patent: May 2, 2006

(54) CAPACITOR AND METHOD OF PRODUCING SAME

(75) Inventors: Kiyoshi Ooi, Nagano (JP); Noriyoshi Shimizu, Nagano (JP); Tomoo Yamasaki, Nagano (JP); Yasuyoshi Horikawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/968,725

(22) Filed: Oct. 18, 2004

(65) Prior Publication Data

US 2005/0088800 A1  Apr. 28, 2005

(30) Foreign Application Priority Data

Oct. 22, 2003  (JP) .............................. 2003-362155

(51) Int. Cl.
*H01G 9/04* (2006.01)
*H01G 4/005* (2006.01)
*H01G 4/06* (2006.01)

(52) U.S. Cl. ...................... 361/528; 361/303; 361/311
(58) Field of Classification Search ............ 361/301.2, 361/306.2, 523, 528–529, 311, 303–305
See application file for complete search history.

(56) References Cited

U.S. PATENT DOCUMENTS

| | | | |
|---|---|---|---|
| 6,205,013 B1 * | 3/2001 | Gong et al. | 361/306.1 |
| 6,445,564 B1 * | 9/2002 | Naitoh | 361/301.2 |
| 6,620,701 B1 * | 9/2003 | Ning | 438/396 |

FOREIGN PATENT DOCUMENTS

JP    11-68319       3/1999
JP    2001-274034   10/2001

* cited by examiner

*Primary Examiner*—Eric W. Thomas
(74) *Attorney, Agent, or Firm*—Joseph A. Calvaruso; Chadbourne & Parke, LLP

(57) ABSTRACT

A capacitor formed of parallel wiring lines and a capacitor dielectric film positioned between adjacent wiring lines and in direct contact with each of said wiring lines. A method of producing such a capacitor is also disclosed.

15 Claims, 16 Drawing Sheets

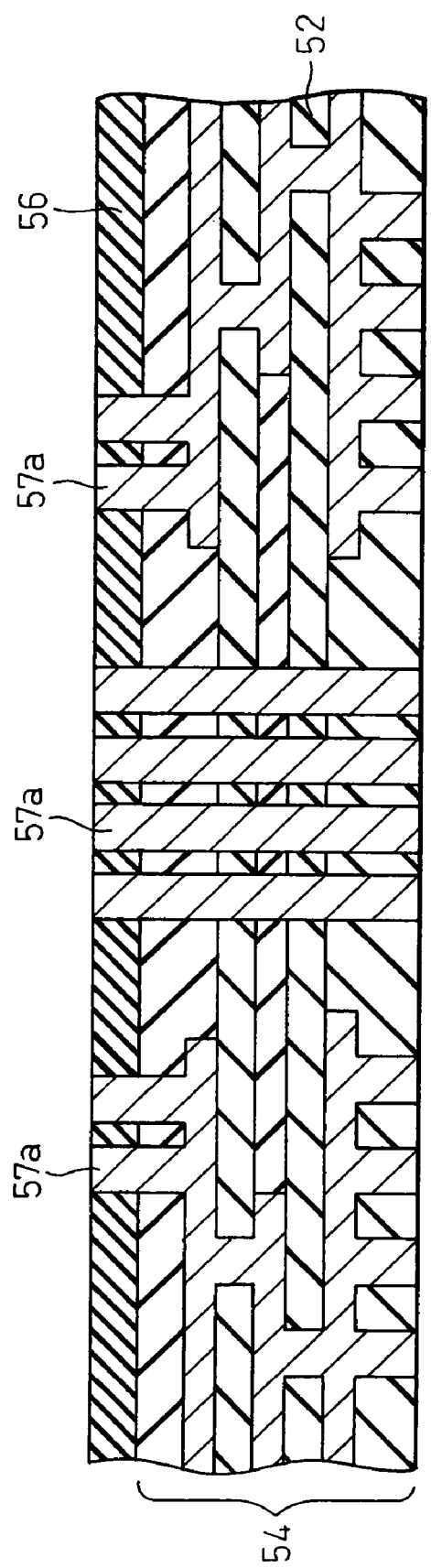

CAPACITOR AND METHOD OF PRODUCING SAME

BACKGROUND OF THE INVENTION

1. Field of the Invention

This invention relates to a capacitor. More particularly, the invention relates to a capacitor which can have an increased capacity by the increase in capacitor effective area and a production method thereof. This capacitor is assembled into a semiconductor package or a wiring substrate or can be used as a single electronic component.

2. Description of the Related Art

A capacitor fabricated and built in a semiconductor device package or a wiring substrate is described in JP 11-68319 A, for example. A capacitor assembled as an electronic component into a semiconductor device package is described in JP 2001-274034 A, for example.

The capacitors of the prior art disclosed in JP 11-68319 A and JP 2001-274034 A are of a parallel flat sheet type in which a dielectric film is sandwiched between an upper electrode layer and a lower electrode layer. FIG. 12 schematically shows such a parallel flat sheet type capacitor. The capacitor shown in the drawing is made up of a lower electrode 204, a dielectric film 206 and an upper electrode 208 that are serially formed on an insulating material layer 202. The lower electrode 204 and the upper electrode 208 are respectively connected to wiring lines 216 and 218 for connecting the capacitor to other circuit components through connection terminals 212 and 214 that penetrate through an insulating layer 210 covering the capacitor. A protective film (insulating material film) 220 is disposed on the wiring lines 216 and 218.

As shown in FIG. 12, the parallel flat sheet type capacitor employs a construction in which the connection terminals 212 and 214 for connecting the capacitor to other circuit components are taken out from the lower electrode 204 and the upper electrode 208, respectively. In such a construction, the wiring line must be extended from the end of each electrode 204, 208 to a connection portion with each connection terminal 212, 214 and a resistance component and an inductance component accordingly become unavoidably large. Because the shapes of the upper and lower electrodes 208 and 204 are asymmetric, stable capacitor characteristics cannot be obtained easily, especially when the capacitor is used while connected to a radio frequency power source such as in the case of a capacitor built in a package substrate for mounting an LSI. Furthermore, a planar area (effective area) of the portion for forming the capacitor is limited and an increase in the capacity is therefore limited.

SUMMARY OF THE INVENTION

It is an object of the invention to provide a capacitor that can have an increased capacity by the increase in capacitor effective area and can be assembled into a semiconductor device package or a wiring substrate, or can be used solely as an electronic component, and a production method of such a capacitor.

It is one of the features of the capacitor according to the invention that it is formed of parallel wiring lines and a capacitor dielectric film interposed between adjacent wiring lines and in direct contact with each of the adjacent wiring lines.

The term "direct contact" herein used for the capacitor according to the invention means that the capacitor dielectric film is in contact with a portion of the wiring line corresponding to a capacitor electrode through no other member and that an area of the portion of the wiring line in contact with the dielectric film is equal to the surface area of the dielectric film.

The wiring lines are preferably arranged in a grid form.

A sectional shape of the wiring line is preferably rectangular and more preferably square. In the case of the section of the wiring line having the square shape, an aspect ratio of a portion of the wiring line in contact with the capacitor dielectric film is preferably at least ¼.

A width of the portion of the wiring line that is in contact with the capacitor dielectric film is preferably greater than the width of other portions.

Further preferably, a dielectric constant of the capacitor dielectric film is greater than 10.

The capacitor according to the invention can be produced by a production method that includes the steps of forming a capacitor dielectric layer on an insulating material layer, and forming parallel wiring lines penetrating through the capacitor dielectric layer.

Preferably, the capacitor dielectric layer is deposited and formed on one of the adjacent wiring lines and then the other wiring line is formed in contact with the capacitor dielectric layer thus formed. To form the capacitor dielectric layer, any method such as spin coating, sputtering, CVD, evaporation, electro-deposition, anodic oxidation or a sol-gel method may be employed.

According to the invention, it is feasible to use a capacitor having no extension of the wiring lines from the electrodes and having an extremely small inductance. In addition, because a wiring line length can be decreased, the resistance can be lowered. Because the impedance becomes smaller when the resistance and the inductance are smaller, the invention can provide a capacitor having small impedance due to the effect described above.

By increasing the aspect ratio of the wiring section as the effective area of the capacitor and narrowing a wiring pitch, the invention can provide a capacitor having a greater capacity than the parallel flat sheet type capacitors of the prior art. The greater the capacity of the capacitor, the smaller the impedance. From this aspect, too, the capacitor according to the invention is advantageous for lowering the impedance.

BRIEF DESCRIPTION OF THE DRAWINGS

FIG. 11D illustrates the step of forming vias by filling a plating material into the via holes;

DESCRIPTION OF THE PREFERRED EMBODIMENTS

Figure 1A:
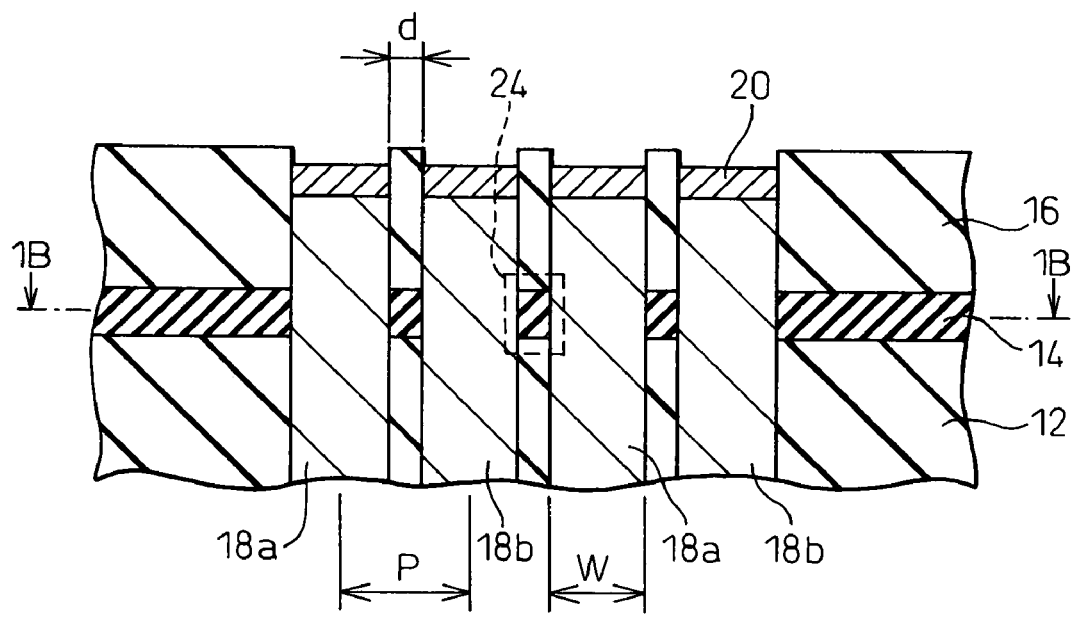
FIGS. 1A and 1B illustrate a capacitor according to the invention.
Figure 1B:
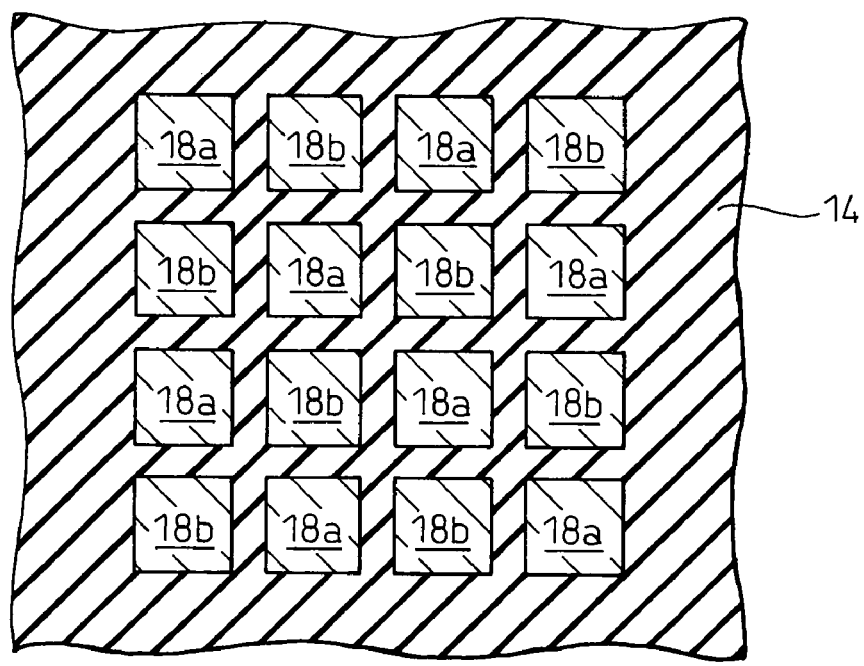

FIG. 1A is a longitudinal sectional view of a capacitor according to the invention and FIG. 1B is its transverse sectional view. These drawings show the capacitor built in a build-up substrate of a package for a semiconductor device used for mounting a semiconductor chip (not shown) to a mounting substrate (not shown).

Referring to FIG. 1A, a layer 14 of a capacitor dielectric material is positioned on an insulating material layer 12 of the build-up substrate and a protective film 16 of an insulating material such as a solder resist covers the capacitor dielectric material layer 14. Power source wiring lines 18a and ground wiring lines 18b connected to a semiconductor chip, such as an LSI mounted on this substrate, penetrate through the substrate. Pads 20 connected to the mounted semiconductor chip are disposed on the top of the respective wiring lines. The layer 14 constituting the capacitor dielectric is preferably formed of a high dielectric constant material such as a dielectric material having a dielectric constant ε of greater than 10. Examples of the dielectric material that can be used for the capacitor of the invention include inorganic high dielectric constant materials such as $Ta_2O_5$, BST, STO, BTO, and resin-based materials in which fillers of these inorganic high dielectric constant materials are contained in resins such as epoxy resin or polyimide resin. Materials similar to those used in ordinary package substrates for semiconductor chips can be used as the material for members other than the layer 14.

Referring to FIG. 1A, a portion 24 indicated by broken line and including the dielectric material layer 14 interposed between the adjacent wiring lines 18a and 18b constitutes the capacitor. The dielectric material layer 14 is formed as a film that is parallel to the chip mounting surface of the build-up substrate. In this example, the wiring lines 18a and 18b represent vias that penetrate through the film-like dielectric material layer 14 in the direction of thickness. The capacitor is constituted by wiring lines for power source system (power source wiring lines and ground wiring lines) for the package for semiconductor chips and the dielectric film sandwiched between them. The power source system wiring lines themselves are used as the electrodes of the capacitor. To form the capacitor conveniently by interposing the dielectric film between the adjacent wiring lines, it is preferred to alternately form the power source wiring lines 18a and the ground wiring lines 18b as shown in the drawing.

As can be clearly seen from FIG. 1A, in the capacitor of the invention, the wiring lines 18a and 18b are in direct contact with the dielectric film 14 and constitute two electrodes of the capacitor. Moreover, the wiring lines 18a and 18b and the dielectric film 14 are in contact with one another throughout the entire effective surface of the capacitor. For this reason, the capacitor according to the invention is completely free from the problem of the capacitors of the prior art, that is, the extension of the wiring lines from the ends of the electrodes to the connection terminals of the wiring lines. Because the power source wiring line 18a and the ground wiring line 18b can be formed structurally symmetrically with each other, unstable factors at the time of feeding the radio frequency current, that have been another problem with the capacitors of the prior art, can also be eliminated.

In the capacitor according to the invention, the capacity of the capacitor can be increased by narrowing the gap d between the wiring lines constituting the two electrodes of the capacitor (see FIG. 1A). When the pitch P of the adjacent wiring lines (see also FIG. 1A) is decreased, the offset effect of the inductance between the power source wiring line and the ground wiring line can be improved and this is advantageous for lowering the inductance. The greater the wiring width W (see FIG. 1A), the smaller becomes the electrode resistance.

Figure 10A:
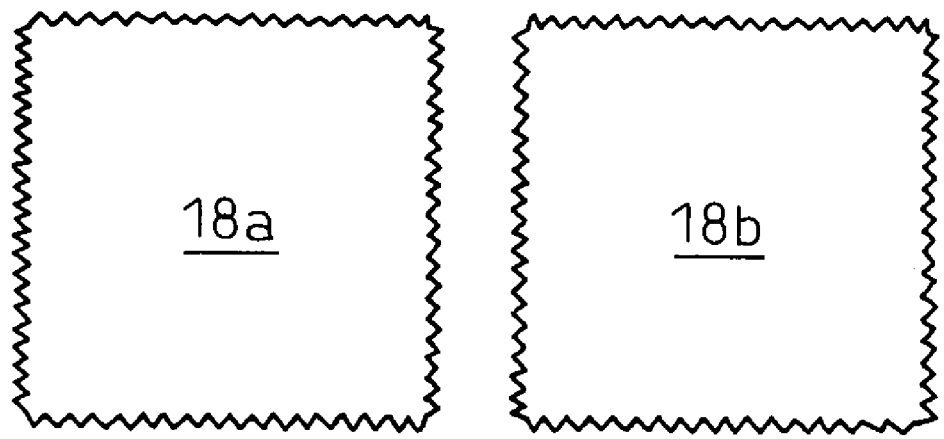
FIGS. 10A and 10B each show an example of a sectional shape of wiring lines in the invention.
Figure 10B:
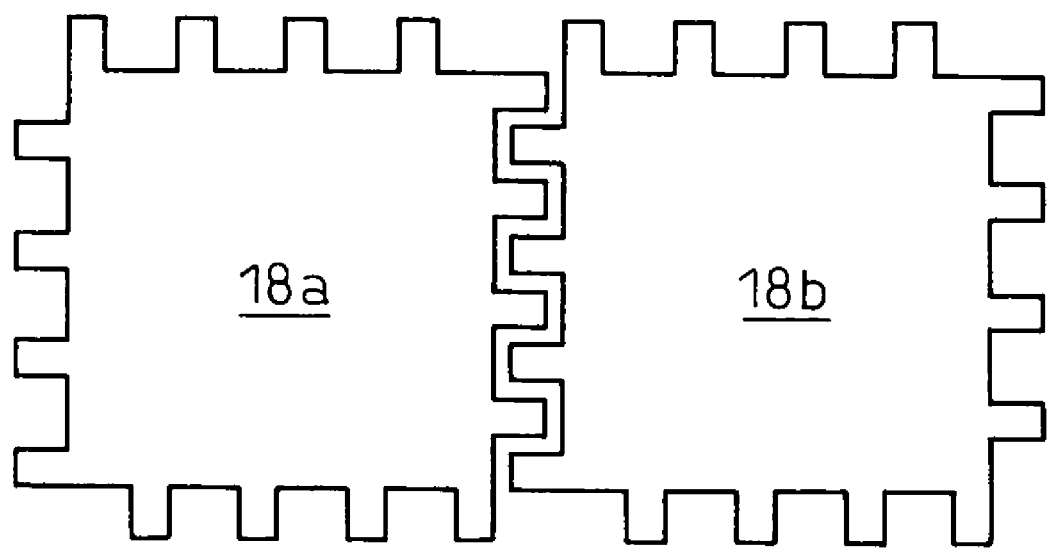

On the other hand, the wiring line can be formed into any shape but a rectangular sectional shape is desirable because the effective area of the capacitor becomes greater when the areas facing each other while interposing the dielectric film becomes greater. Particularly preferred is a square sectional shape. A further preferred sectional shape is a sectional shape provided around its periphery with fine concavo-convexities as shown in FIG. 10A or a sectional shape provided around its periphery with concavo-convexities or protuberances so as to provide comb-like engagement between adjacent wiring lines as shown in FIG. 10B.

As to the arrangement of the wiring lines, the capacitor can be constituted when at least two adjacent wiring lines interposing the capacitor dielectric film exist. However, the wiring lines are preferably arranged in the grid form from the aspects of the reduction of mutual conductance by the alternate transmission line network and the increasing effect of the capacitor effective area.

In the case of the capacitor the wiring line shape of which is the square sectional shape as illustrated in FIG. 1B, an effective area greater than that of the parallel flat sheet type capacitor of the prior art can be obtained when the aspect ratio (height/sectional width ratio) of the wiring line of the capacitor portion 24 (see FIG. 1A) is equal to or greater than ¼. This will be explained with reference to FIGS. 2A and 2B.

Figure 2A:
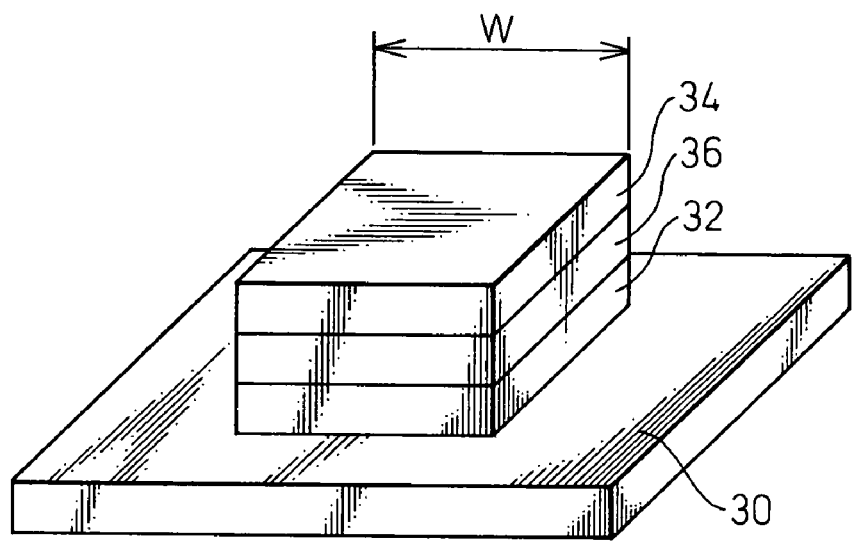
FIGS. 2A and 2B illustrate a relation between an aspect ratio of a wiring line and an effective area in the capacitor according to the invention.
Figure 2B:
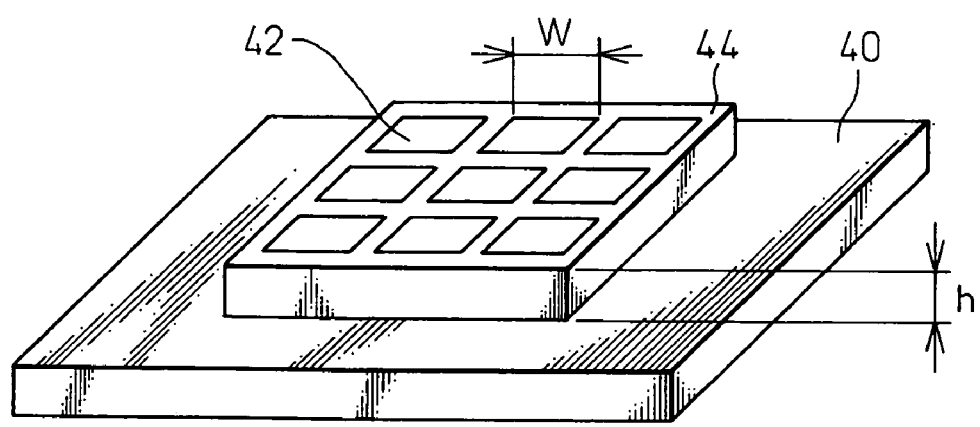

FIG. 2A shows a parallel flat sheet type capacitor according to the prior art. This capacitor is made up of lower and upper square electrodes 32 and 34 each having a width W for each side and positioned on an insulating material layer 30, and a dielectric film 36 sandwiched between these electrodes 34 and 32. FIG. 2B shows a capacitor according to the invention. This capacitor is made up of a dielectric film 44 disposed on the insulating material layer 40 and nine wiring lines 42 penetrating through it. Each wiring line has a square shape having a width W for each side. The effective area of the capacitor shown in FIG. 2A is equal to the area of the surface on which the dielectric film 36 keeps contact with the electrode 32 (or 34) and can be expressed by $W^2$. Referring to FIG. 2B, when one wiring line encompassed by the dielectric film from four sides is taken into consideration, the length W of one side is equal to the length of one side of the parallel flat sheet type capacitor shown in FIG. 2A. The effective area of the capacitor formed by this wiring line and the dielectric film encompassing the wiring line can be expressed by 4 Wh when the height of the capacitor potion is h. It can be appreciated that the condition in which the effective area 4 Wh of the capacitor shown in FIG. 2B is greater than the effective area $W^2$ of the capacitor shown in FIG. 2A is $W^2<4$ Wh, that is, W/h<4. It can thus be appreciated that a greater effective area than that of the parallel flat sheet type capacitor of the prior art can be obtained in the invention when the aspect ratio (height/sectional width ratio (h/W)) of the wiring line of the capacitor portion is at least ¼.

Table 1 given below tabulates the comparison results of the effective area of squares having the width W of each side. The results were obtained by calculation using a variable width W with a fixed height h of the capacitor portion according to the invention of 20 (in arbitrary unit).

TABLE 1

| | | | Effective Area | | |
|---|---|---|---|---|---|
| | | | The Invention (a) | Parallel Flat Sheet Type (b) | Effective Area Ratio |
| W | h | W/h | 4 Wh | $W^2$ | (a)/(b) |
| 150 | 20 | 7.5 | 12,000 | 22,500 | 0.53 |
| 100 | 20 | 5 | 8,000 | 10,000 | 0.80 |
| 80 | 20 | 4 | 6,400 | 6,400 | 1.00 |
| 70 | 20 | 3.5 | 5,600 | 4,900 | 1.14 |
| 50 | 20 | 2.5 | 4,000 | 2,500 | 1.60 |
| 30 | 20 | 1.5 | 2,400 | 900 | 2.67 |

Figure 3:
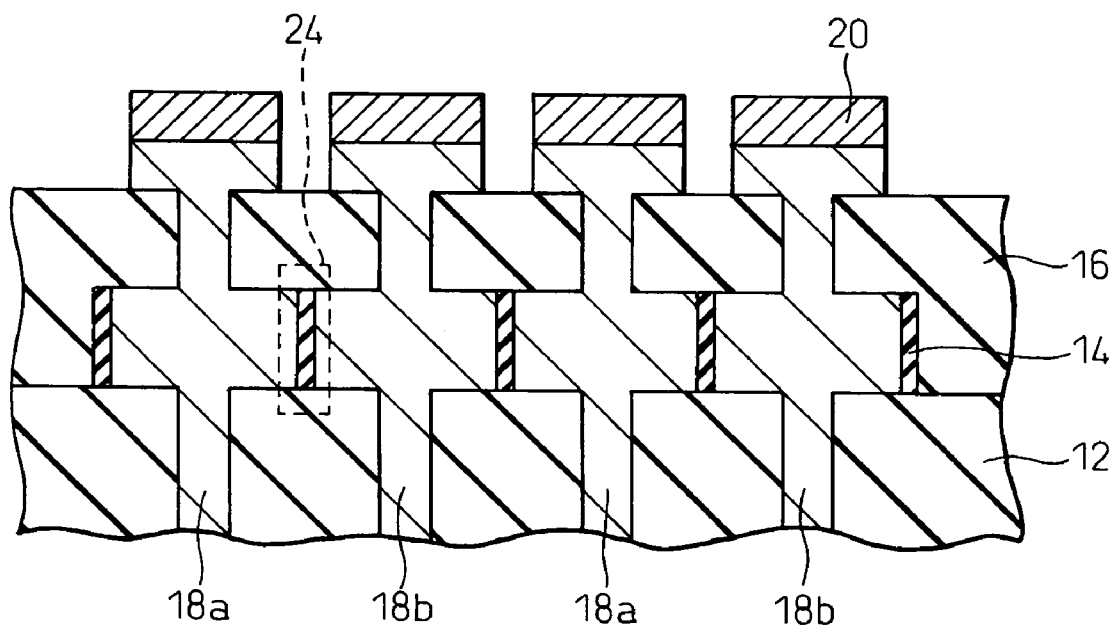
FIG. 3 illustrate a preferred embodiment of the capacitor according to the invention.

As explained above, in order to increase the capacitance of the capacitor of the invention, it is effective to make smaller the gap d (see FIG. 1A) between the wiring lines that constitute the two electrodes of the capacitor. FIG. 3 shows an example of the structure that readily makes such a construction feasible. The capacitor shown in this drawing can be used solely as a capacitor of an electronic component. This capacitor is constituted by the same members as those of the capacitor illustrated with reference to FIG. 1A. Therefore, each member is denoted by the same reference numeral as in FIG. 1A. The difference of this capacitor from the capacitor of FIG. 1A is that the width of the wiring lines 18a and 18b becomes greater at the capacitor portion 24 in the capacitor shown in FIG. 3 and consequently, the width of the dielectric material layer 14 sandwiched between these wiring lines is narrowed. The capacity of the capacitor can thus be increased by narrowing the gap d between the wiring lines constituting the electrodes. The thin dielectric film interposed between the wiring lines (electrodes) the gap of which is more narrowed can be formed by utilizing patterning technology, plating technology and the like that are ordinarily employed in the field of the semiconductor industry, as described later. In this case, the thickness of the dielectric film can be reduced to several micrometers (µm), for example.

It is to be noted that, in this embodiment wherein the width of the wiring lines 18a and 18b is increased and the width (thickness) of the dielectric material layer 14 sandwiched between the wiring lines is narrowed, the height of the portion of the wiring lines corresponding to the electrodes and the height of the dielectric material layer are the same and the area of the wiring lines contacting the dielectric film and the surface area of the dielectric film are the same.

Figure 4:
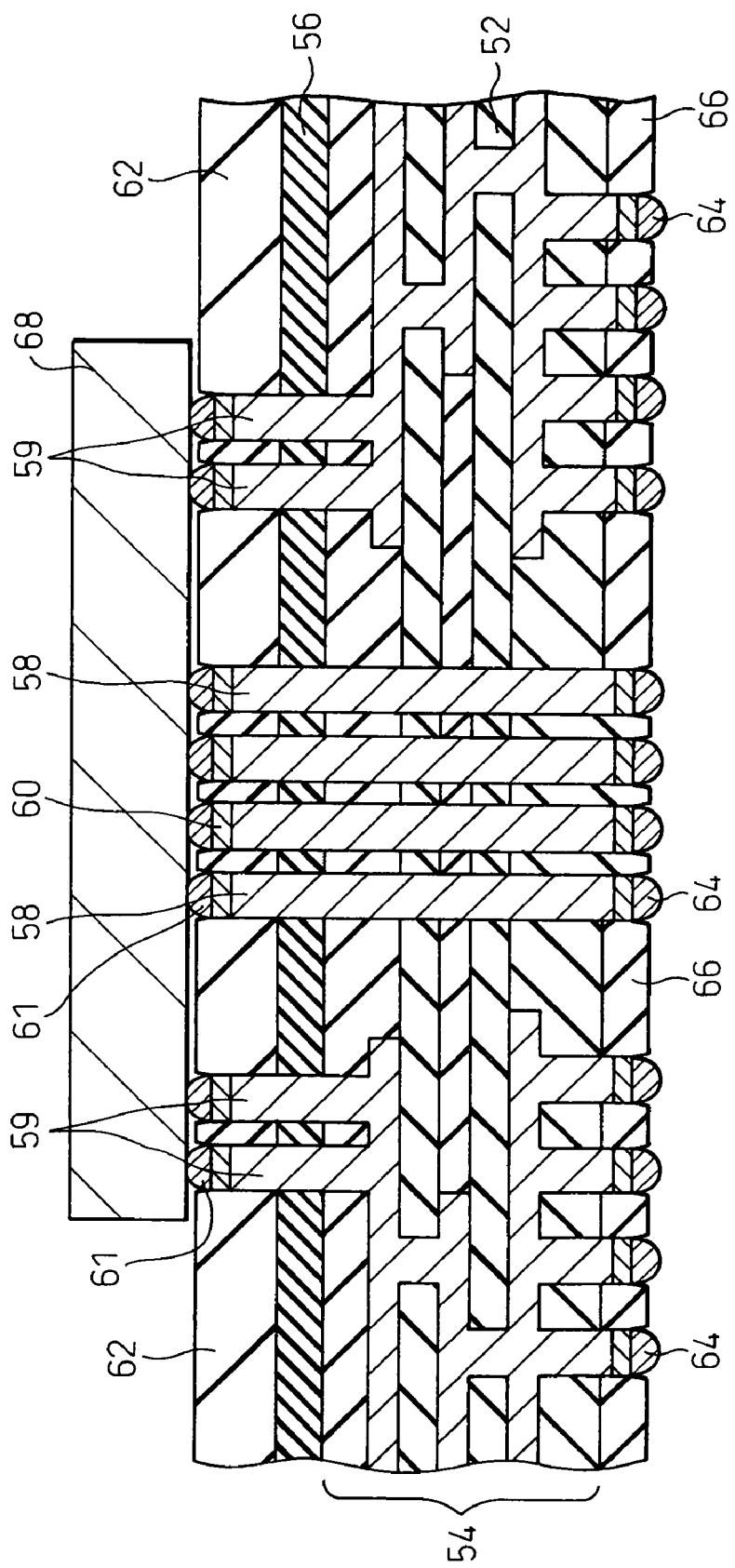
FIG. 4 shows a package substrate having the capacitor of the invention built therein.

FIG. 4 shows a package substrate in which the capacitors of the invention are built. In this package substrate, a high dielectric constant material layer 56 is formed on a build-up portion 54 fabricated by forming a build-up layer on both surfaces of a core substrate 52, and wiring lines 58 for power source system (inclusive of power source wiring lines and ground wiring lines) and signal wiring lines 59 penetrate through the high dielectric constant material layer 56. The wiring portions penetrating through the high dielectric constant material layer 56 are vias. The capacitor according to the invention is formed at the portion at which the wiring lines 58 for power source system penetrate through the high dielectric constant material layer 56. Pads 60 and bumps 61 are provided at the upper ends of these wiring lines so as to connect to a semiconductor chip (LSI, for example) 68 to be mounted on this substrate, and a protective film 62 formed of a solder resist, for example, is also provided. Bumps 64, used for mounting the package substrate having the semiconductor chip mounted thereon to a mounting substrate (not shown), and a protective film 66 are provided below the build-up portion 54.

The capacitor according to the invention can be produced by a production method including the steps of forming a capacitor dielectric layer on an insulating material layer and forming parallel wiring lines penetrating through the capacitor dielectric layer.

For example, the capacitor having the construction explained with reference to FIG. 3 can be produced in the following way with reference to FIGS. 5A to 5F. A capacitor, the manufacture of which will be herein explained, is used as a capacitor, as an electronic component or as a capacitor that is assembled into a package for a semiconductor device, and is fabricated on a silicon substrate. FIGS. 5A to 5F show only three wiring lines among the wiring lines that constitute the capacitor.

Figure 5A:
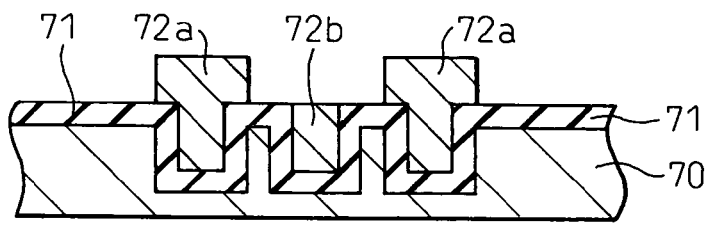
FIGS. 5A to 5F illustrate a production method of the capacitor according to the invention.
Figure 5B:
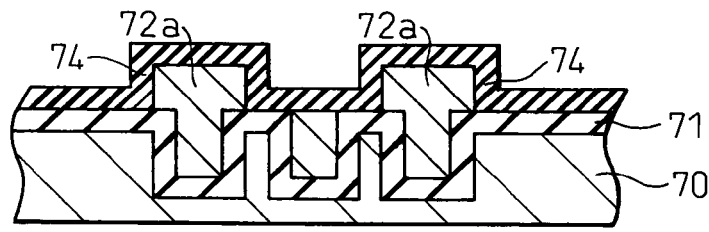

As shown in FIG. 5A, blind vias are formed in a silicon substrate 70 and an insulating layer 71 of $SiO_2$ is formed by thermal oxidation treatment on the surface of the silicon substrate 70 inclusive of the inside of the blind vias. When an insulating substrate of a resin substrate or the like is used in place of the silicon substrate 70, the insulating layer 71 need not be formed. Next, a layer of a wiring material formed by plating or sputtering in such a manner as to fill the vias and cover the entire surface of the insulating layer 71 is patterned, to thereby form wiring members 72a (height: 20 µm) having, above the insulation layer 71, a square portion having a width (100 µm) greater than the width 50 µm of the portion buried into the vias, and wiring members 72b having a level equal to the surface of the insulating material layer, in such a manner that they are alternately arranged. Cu, Al, Pt, Au or the like can be used as the material of the wiring members, for example. Next, a dielectric material is deposited to cover the entire surface of the substrate on which the wiring members 72a and 72b are formed, by utilizing sputtering, CVD, evaporation or the like, for example, to form the capacitor dielectric film 74 as shown in FIG. 5B. $Ta_2O_5$, BST, STO or the like can be used as the dielectric film material, for example. The thickness of the dielectric film varies depending on the application of the capacitor fabricated but can be generally of the order of about 10 nm to 10 µm.

Figure 5C:
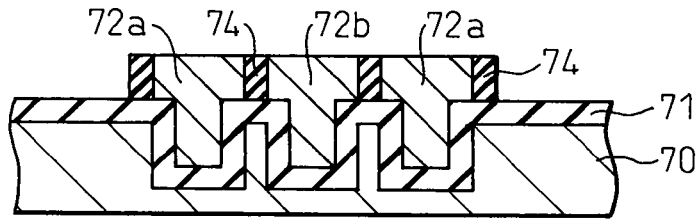
Figure 5D:
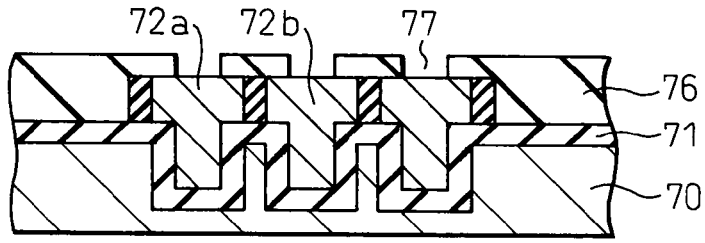
Figure 5E:
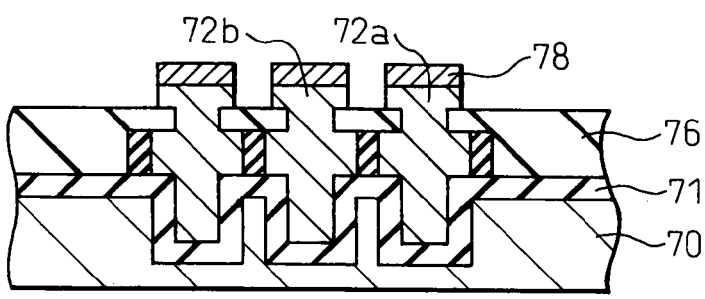
Figure 5F:
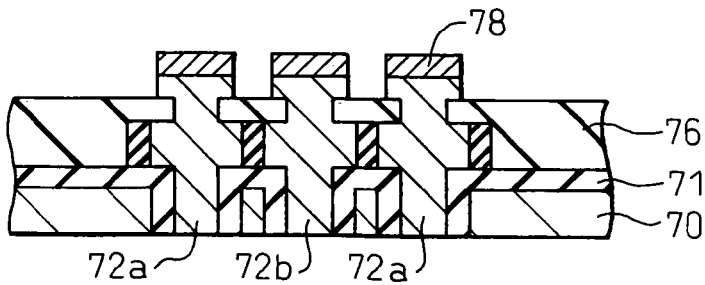

Subsequently, the dielectric film on the wiring member 72b is removed by a process such as laser processing or dry etching to expose the upper end of the wiring member 72b. A wiring material that forms the upper part of the wiring member 72b is filled between two wiring members 72a having the dielectric film 74 formed on the side wall, by electrolytic plating, for example, and is then planarized by polishing, etc, to align the height of the upper ends of the wiring members 72a and 72b (FIG. 5C). Thereafter, a protective film 76 having openings 77 for exposing the upper ends of the wiring members is formed of, for example, a solder resist (FIG. 5D). The wiring material is filled in each opening 77 and a pad 78 is formed thereon (FIG. 5E). The pad 78 can be formed by serially forming a Ni film and an Au film, for example. Finally, as shown in FIG. 5F, the silicon substrate 70 is polished from its lower surface to reduce the thickness and to expose the wiring members 72a and 72b on the lower surface of the substrate.

Figure 11A:
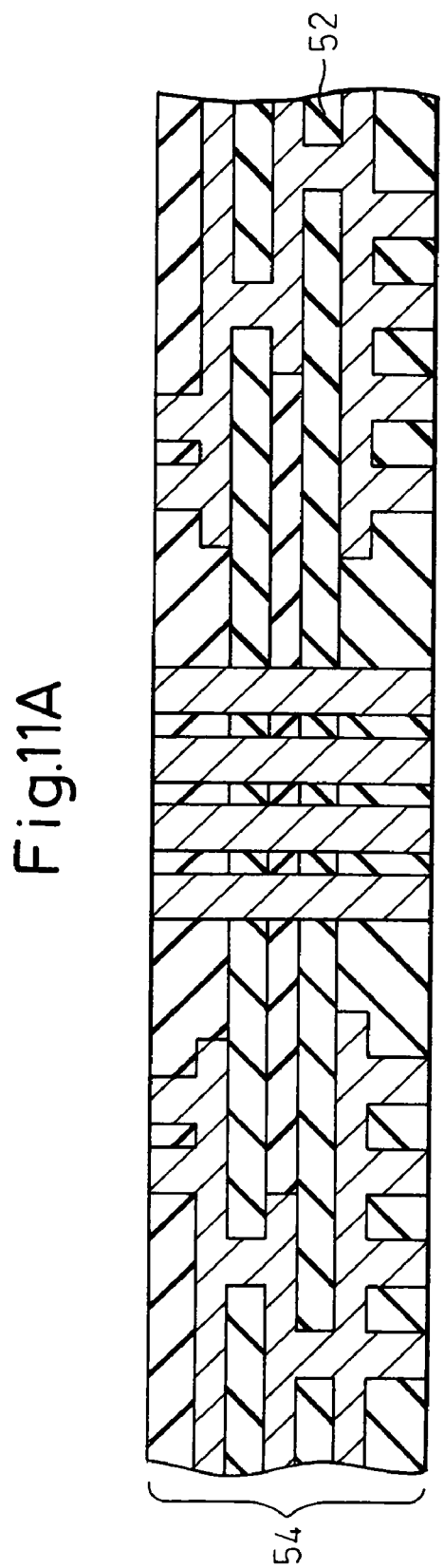
FIG. 11A shows a build-up portion before a high dielectric constant material layer is formed in the production process of a build-up package substrate having the capacitor of the invention built therein.
Figure 11B:
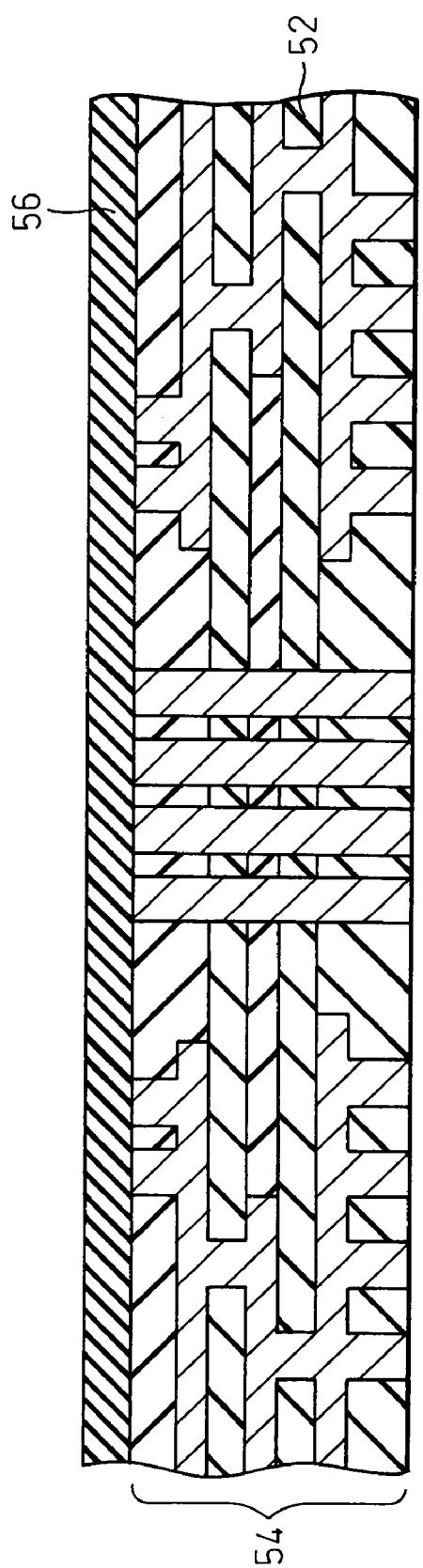
FIG. 11B illustrates the step of forming a high dielectric constant material layer on one of the surfaces of the build-up portion.
Figure 11C:
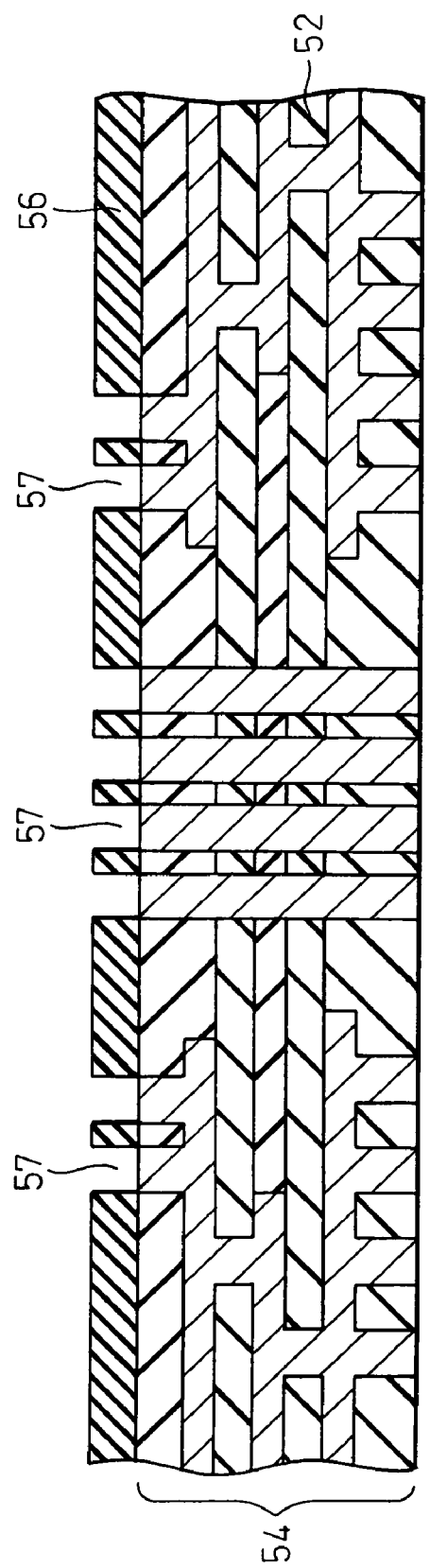
FIG. 11C illustrates the step of forming via-holes in the high dielectric constant material layer.
Figure 11E:
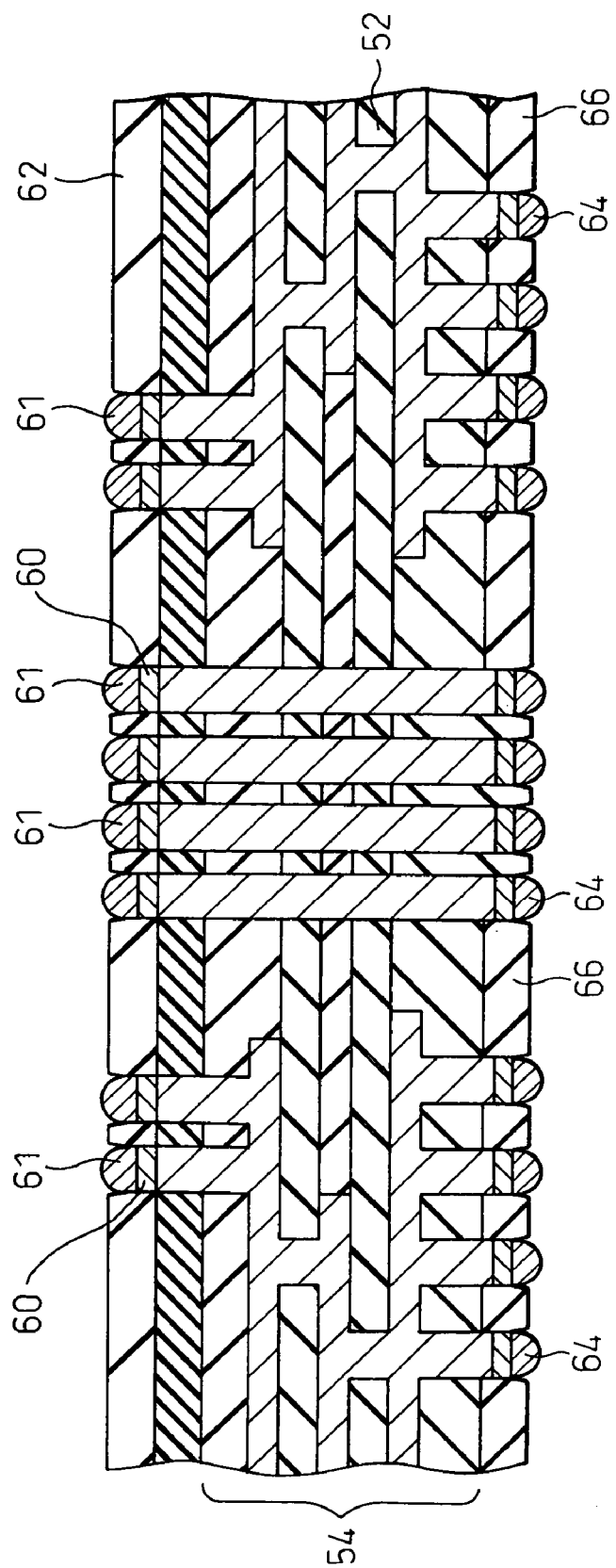
FIG. 11E illustrate the formation of a protective film, pads and bumps.
Figure 12:
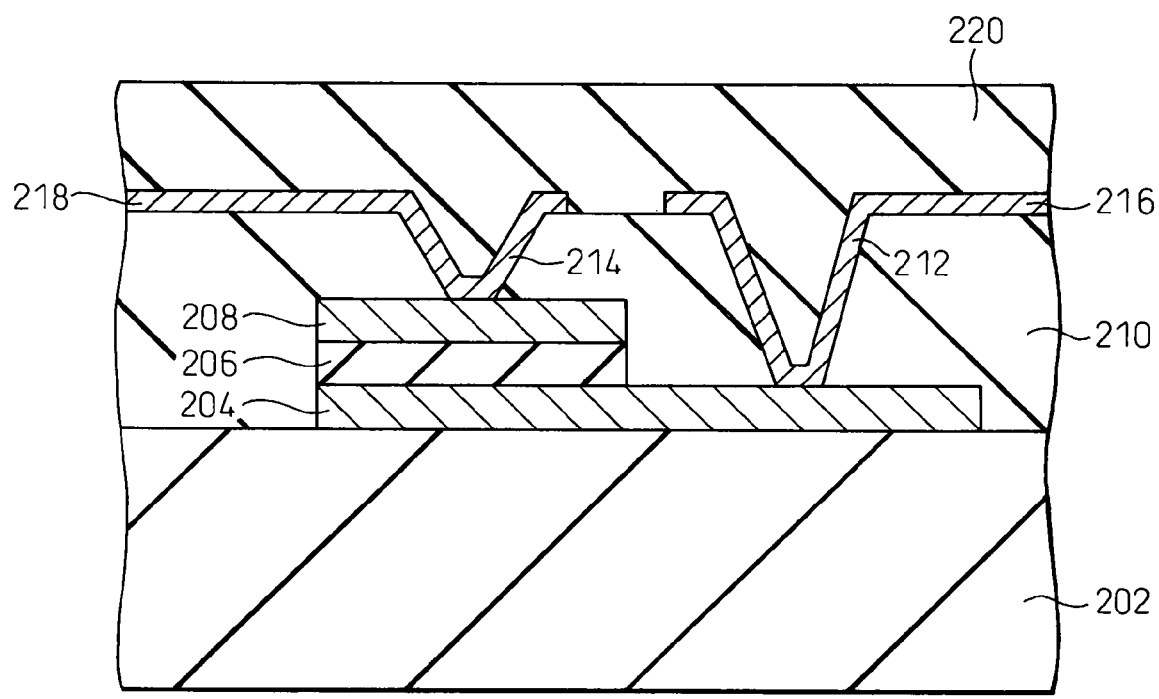
FIG. 12 illustrates a parallel flat sheet type capacitor according to the prior art.

The build-up package substrate having the capacitor of the invention built therein and shown in FIG. 4 can be produced in the following way. First, the production up to the build-up portion represented by 54 in FIG. 4 is conducted in accordance with the production steps of the ordinary build-up substrate as shown in FIG. 11A. Next, a high dielectric constant material layer 56 is formed on one of the surfaces of the build-up portion 54 as shown in FIG. 11B. To form the high dielectric constant material layer 56, it is possible to employ a method that stacks resin films having fillers of the high dielectric constant material such as $Ta_2O_5$, BST, STO or BTO dispersed in a resin such as an epoxy resin or a polyimide resin. It is also possible to employ spin coating of a resin paste containing a filler of high dielectric constant material, sputtering, CVD, evaporation, electro-deposition, anodic oxidation and sol-gel method to form the high dielectric constant material layer 56. Subsequently, via holes 57 are formed in the high dielectric constant material layer 56 by laser processing, dry etching or the like (FIG. 11C) and copper is filled into the via holes 57 by electroplating of copper, for example, to form vias 57a (FIG. 11D). Next, the surface is planarized by polishing or the like (FIG. 11D), whenever necessary. A protective film 62 is then formed, pads 60 are formed by nickel plating and gold plating, and bumps 61 are formed by using solder balls or the like, as shown in FIG. 11E.

The formation of the capacitor dielectric film explained with reference to FIG. 5B can be carried out by various methods such as electro-deposition, anodic oxidation, so-gel method and the like, besides sputtering, CVD and evaporation mentioned above.

Figure 6A:
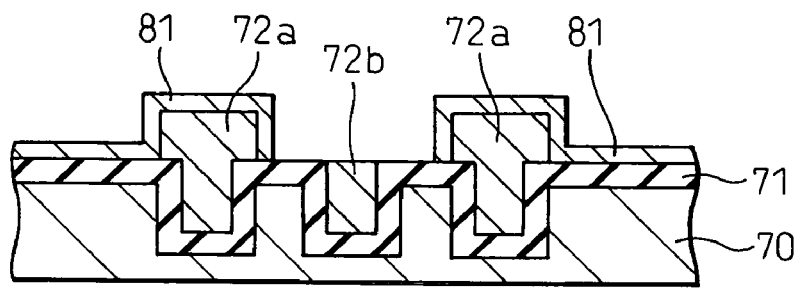
FIGS. 6A to 6D illustrate a formation method of a capacitor dielectric film in the capacitor according to the invention.
Figure 6B:
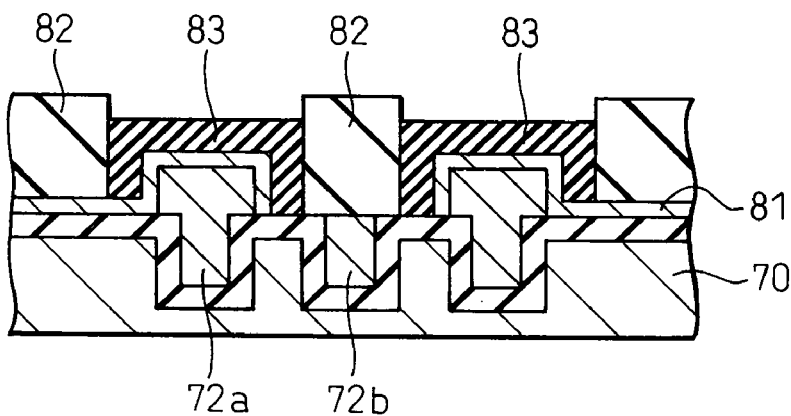
Figure 6C:
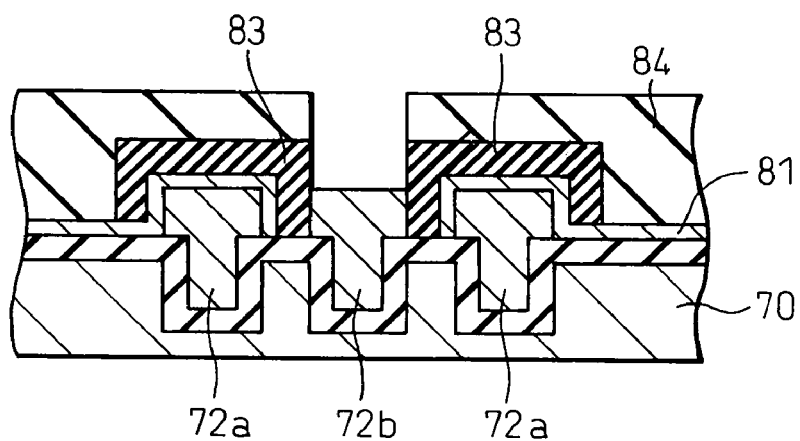
Figure 6D:
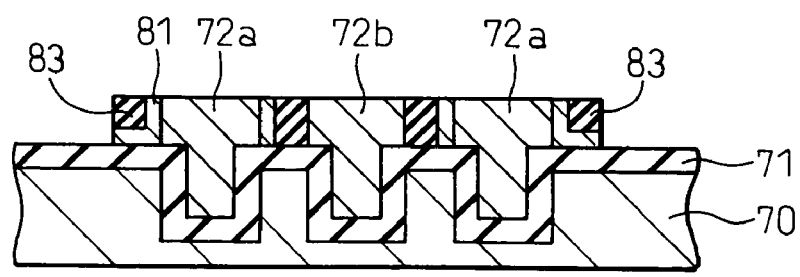

When electro-deposition is employed, for example, a seed layer 81 formed on the entire surface of the substrate is patterned, as shown in FIG. 6A, after the wiring members 72a and 72b shown in FIG. 5A are formed, to thereby remove the seed layer material at the area between the two wiring members 72a. Next, a capacitor dielectric material 83 is selectively electro-deposited on the seed layer 81 by using a resist pattern 82, as shown in FIG. 6B. After the resist pattern 82 is removed, another resist pattern 84 (FIG. 6C) exposing the area from which the seed layer material is removed in the step of FIG. 6A is formed, and a wiring material is filled in the exposed area by electro-plating. Next, after the resist pattern 84 is removed, the height of the upper ends of the wiring members 72a and 72b are aligned by planarization such as polishing, as shown in FIG. 6D.

Figure 7A:
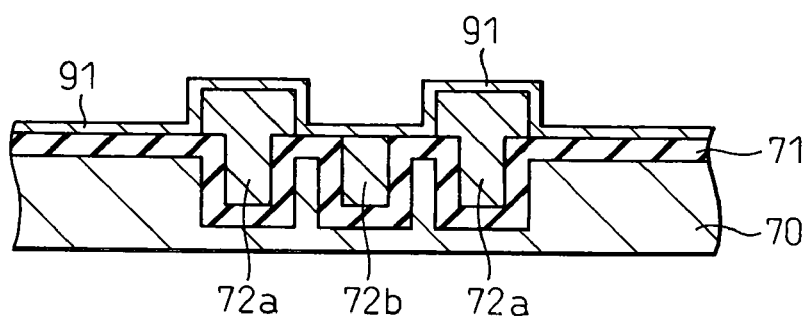
FIGS. 7A to 7D illustrate another formation method of the capacitor dielectric film in the capacitor according to the invention.
Figure 7B:
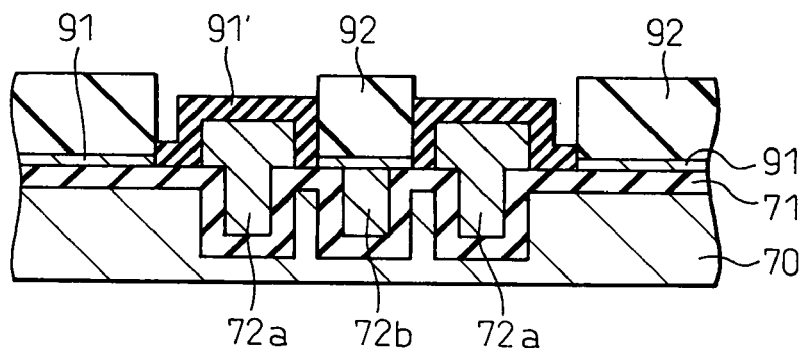
Figure 7C:
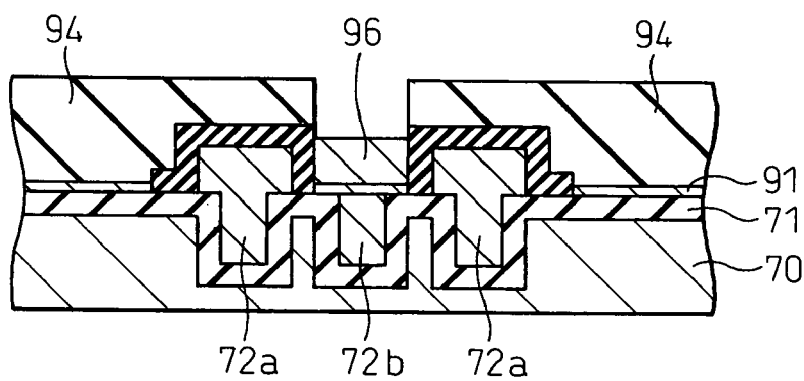
Figure 7D:
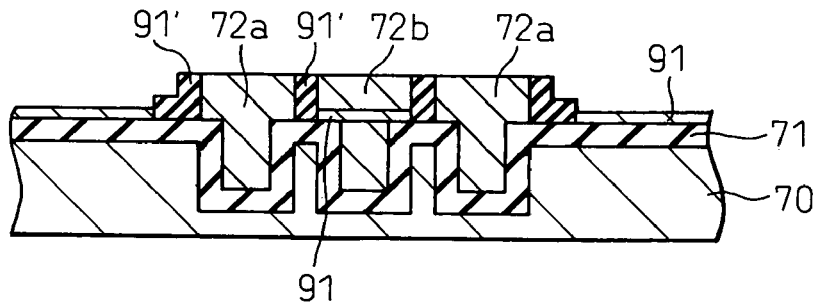

When anodic oxidation is employed, the formation of the wiring members 72a and 72b shown in FIG. 5A is followed by the formation of a layer 91 of a dielectric formation material (precursor) such as Ta using sputtering, for example, on the entire surface of the substrate, as shown in FIG. 7A. Next, a resist pattern 92 is formed as shown in FIG. 7B and the Ta layer 91 is selectively subjected to anodic oxidation using the resist pattern 92 as a mask to form a dielectric film 91' of $Ta_2O_5$. After the resist pattern 92 is removed, another resist pattern 94 for exposing an area between the two wiring members 72a is formed as shown in FIG. 7C and a wiring material 96 is filled in this exposed area by electroplating. Next, after the resist pattern 94 is removed, the height of the upper ends of the wiring members 72a and 72b is aligned by planarization such as polishing (FIG. 7D). In the example explained herein, the Ta layer 91 is contained in the wiring member 72b but may be removed during an intermediate step.

Figure 8A:
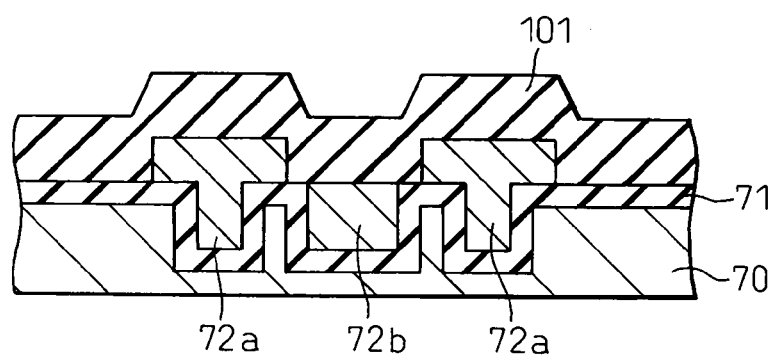
FIGS. 8A to 8D illustrate still another formation method of the capacitor dielectric film in the capacitor according to the invention.
Figure 8B:
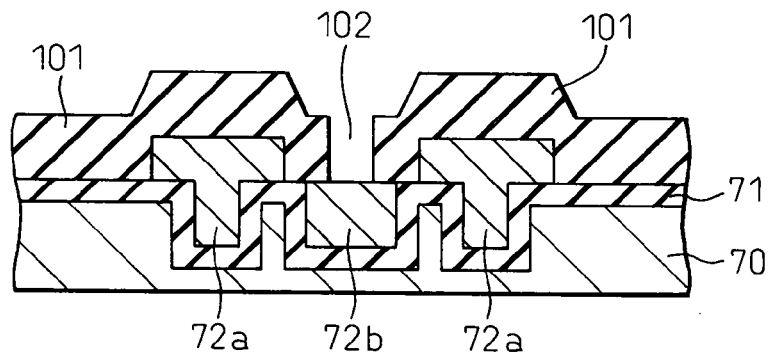
Figure 8C:
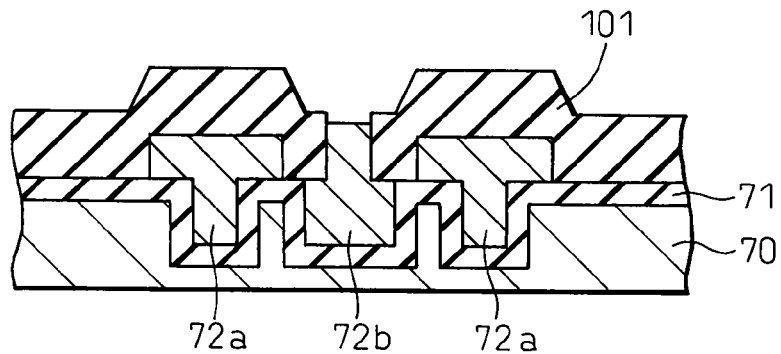
Figure 8D:
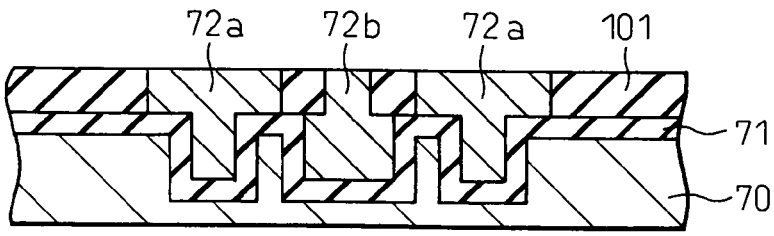

Alternatively, the formation of the capacitor dielectric film can be also carried out by using a high dielectric constant sheet material. In this case, the high dielectric constant sheet material 101 of polyimide, epoxy or the like containing fillers of BTO, STO, etc, is laminated to the entire surface of the substrate as shown in FIG. 8A after the wiring members 72a and 72b of FIG. 5A are formed. Next, a part of the sheet material 101 on the wiring member 72b is removed to provide an opening 102 as shown in FIG. 8B. Subsequently, a wiring material is filled in the opening 102 by electro-plating as shown in FIG. 8C. Finally, the height of the upper ends of the wiring members 72a and 72b is aligned by planarization such as polishing (FIG. 8D).

The capacitor according to the invention can also contain an electrolyte layer, in addition to the dielectric film, between the two wiring lines constituting the electrode. The capacitor having the electrolyte layer (generally known as "electrolytic capacitor") can be used as a capacitor having a large capacity. In the electrolytic capacitor according to the invention, it is possible to employ two constructions, that is, a construction in which the dielectric film is in contact with only one of the wiring lines and the electrolyte layer is in contact with the other wiring line and a construction in which the dielectric films are in contact with both of the wiring lines, respectively, and the electrolyte layer is interposed between these dielectric films. In the case of the former, the dielectric film is in contact with one of the wiring lines through the electrolytic layer, which represents an exception to "direct contact" defined previously.

Figure 9A:
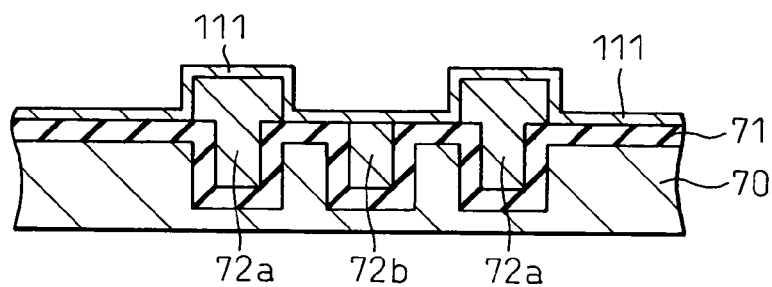
FIGS. 9A to 9E illustrate the production of an embodiment of the capacitor of the invention provided with an electrolytic layer.
Figure 9B:
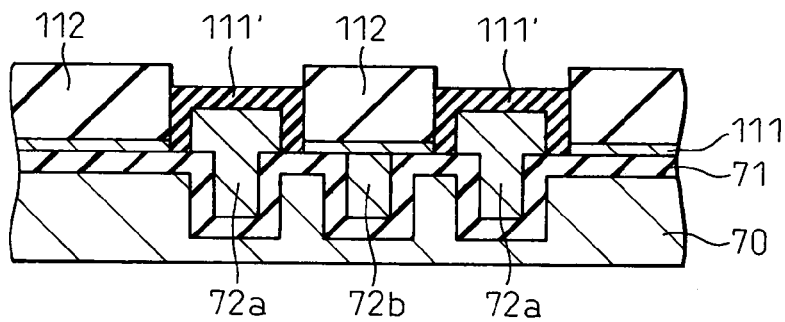
Figure 9C:
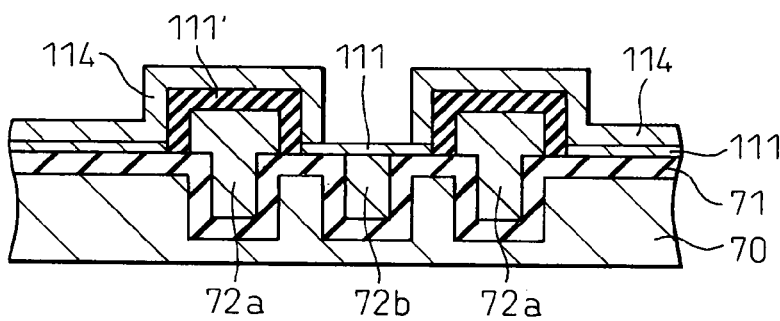
Figure 9D:
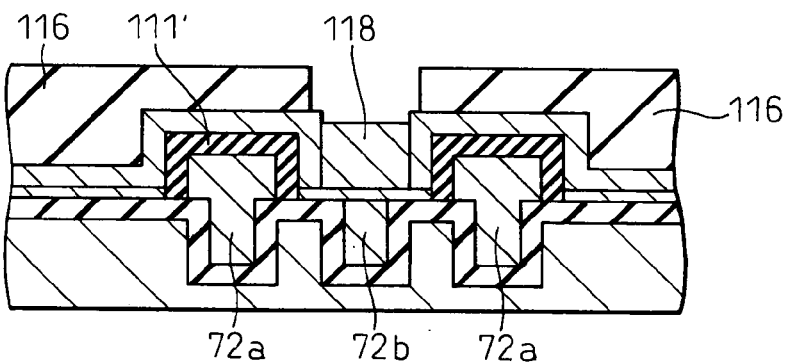
Figure 9E:
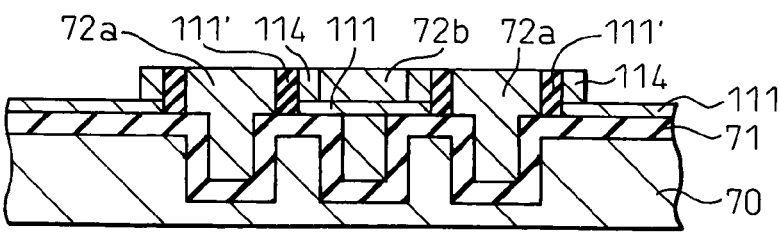

In the embodiment where the capacitor includes the electrolytic layer, the dielectric film and the electrolytic layer can be formed in the following way, for example. A layer 111 of a dielectric formation material (precursor) such as Ta is formed on the entire surface of the substrate as shown in FIG. 9A after the wiring members 72a and 72b shown in FIG. 5A are formed. Next, as shown in FIG. 9B, a resist pattern 112 is formed, and the Ta layer 111 is subjected to selective anodic oxidation using the resist pattern 112 as a mask to form a $Ta_2O_5$ dielectric film 111'. After the resist pattern 112 is removed, an electrolytic layer 114 is formed on the entire surface of the substrate by using a polymer electrolyte, for example, and a part of the electrolytic layer 114 over the wiring member 72b is so removed as to expose the Ta layer 111 (the exposed Ta layer 111 may be removed subsequently), as shown in FIG. 9C. Next, as shown in FIG. 9D, a resist pattern 116 for exposing an area between the two wiring members 72a is formed and a wiring material is deposited by electroplating onto the Ta layer 111 previously exposed. After the resist pattern 116 is removed, the height of the upper ends of the wire members 72a and 72b is aligned by planarization as shown in FIG. 9E. The production steps of the capacitor other than the formation steps of the dielectric film and the electrolytic layer explained herein are the same as those of the foregoing embodiment. The Ta layer 111 below the electrolytic layer 114 left on the side walls of the wiring line may be removed during an intermediate step.

As described above, the invention makes it possible to provide a capacitor that has low inductance, low resistance and low impedance and can be used as the electronic component as shown in FIG. 3, as the capacitor to be built in the package substrate or as the capacitor to be fabricated and built in the package substrate such as the build-up substrate shown in FIG. 4.

The invention claimed is:

1. A capacitor formed of:
   parallel wiring lines; and
   capacitor dielectric film positioned between adjacent wiring lines and in direct contact with each of said wiring lines,
   wherein the dielectric film is stacked on a layer of insulating material, and the wiring lines perpendicularly penetrate the dielectric film and the insulating material layer.

2. A capacitor as defined in claim 1, wherein said wiring lines are arranged in a grid form.

3. A capacitor as defined in claim 1, wherein a sectional shape of said wiring line is rectangular.

4. A capacitor as defined in claim 1, wherein said wiring line has a sectional shape provided around a periphery thereof with fine concavo-convexities or a sectional shape provided around a periphery thereof with 15 concavo-convexities or protuberances so as to provide comb-like engagement between adjacent wiring lines.

5. A capacitor as defined in claim 1, wherein an aspect ratio of the portion of said wiring line in contact with said capacitor dielectric film is at least ¼.

6. A capacitor as defined in claim 1, wherein the portion of said wiring line in contact with said capacitor dielectric film is rendered broader than other portions.

7. A capacitor as defined in claim 1, wherein one of said adjacent wiring lines is a power source wiring line connected to a semiconductor chip and the other is a ground wiring line.

8. A capacitor as defined in claim 1, wherein said dielectric film is in contact with only one of said adjacent wiring lines and an electrolytic layer is in contact with the other of said adjacent wiring lines.

9. A capacitor as defined in claim 1, wherein both of said adjacent wiring lines are in contact with dielectric films and an electrolytic layer is interposed between said dielectric films.

10. A capacitor as defined in claim 1, wherein the dielectric constant of said capacitor dielectric film is greater than 10.

11. A method of producing said capacitor as defined in claim 1, said method comprising the steps of:
    forming a capacitor dielectric layer on an insulating material layer; and
    forming parallel wiring lines penetrating through said capacitor dielectric layer.

12. A method of producing a capacitor as defined in claim 11, wherein said capacitor dielectric layer is formed by depositing it on one of said adjacent wiring lines and then the other of said adjacent wiring lines is formed in contact with said capacitor dielectric layer thus formed.

13. A method of producing a capacitor as defined in claim 12, wherein said capacitor dielectric layer is formed by spin coating, sputtering, CVD, evaporation, electro-deposition, anodic oxidation or a sol-gel method.

14. A package substrate comprising said capacitor as defined in claim 1.

15. A wiring substrate comprising said capacitor as defined in claim 1.

* * * * *